US010108750B2

(12) United States Patent
Hong et al.

(10) Patent No.: US 10,108,750 B2
(45) Date of Patent: Oct. 23, 2018

(54) METHOD FOR DESIGNING A GEOMETRICAL THREE-DIMENSIONAL MODELED OBJECT

(75) Inventors: Jean Hong, Paris (FR); Mikaël Queric, Paris (FR); Jérôme Derel, Puteaux (FR); Frédéric Letzelter, Longjumeau (FR)

(73) Assignee: Dassault Systemes, Velizy Villacoublay (FR)

( * ) Notice: Subject to any disclaimer, the term of this patent is extended or adjusted under 35 U.S.C. 154(b) by 2 days.

(21) Appl. No.: 13/461,428

(22) Filed: May 1, 2012

(65) Prior Publication Data

US 2012/0287121 A1     Nov. 15, 2012

(30) Foreign Application Priority Data

May 11, 2011   (EP) .................................... 11305564

(51) Int. Cl.
*G06F 17/50* (2006.01)
*G06T 17/20* (2006.01)
*G06T 19/20* (2011.01)

(52) U.S. Cl.
CPC .............. *G06F 17/50* (2013.01); *G06T 17/20* (2013.01); *G06T 19/20* (2013.01); *G06T 2219/2021* (2013.01); *G06T 2219/2024* (2013.01)

(58) Field of Classification Search
CPC ......... G06T 15/00; G06T 17/00; G06T 19/00; G06F 17/50
USPC ....................................................... 345/420
See application file for complete search history.

(56) References Cited

U.S. PATENT DOCUMENTS

| | | | |
|---|---|---|---|
| 5,367,372 | A | 11/1994 | DiVita et al. |
| 5,425,109 | A | 6/1995 | Saga et al. |
| 6,233,351 | B1 | 5/2001 | Feeney et al. |
| 7,099,803 | B1 | 8/2006 | Rappoport et al. |
| 7,248,270 | B1 | 7/2007 | Boylan |
| 7,324,691 | B2 | 1/2008 | Li et al. |
| 7,439,987 | B2 | 10/2008 | Boose et al. |

(Continued)

FOREIGN PATENT DOCUMENTS

| | | |
|---|---|---|
| JP | 05-342310 | 12/1993 |
| JP | 08-076921 | 3/1996 |

(Continued)

OTHER PUBLICATIONS

Takeo Igarashi, Satoshi Matsuoka, and Hidehiko Tanaka. 2007. Teddy: a sketching interface for 3D freeform design. In ACM SIGGRAPH 2007 courses (SIGGRAPH '07). ACM, New York, NY, USA, Article 21.*

(Continued)

*Primary Examiner* — Shivang Patel
(74) *Attorney, Agent, or Firm* — Hamilton, Brook, Smith & Reynolds, P. C.

(57) ABSTRACT

It is proposed a computer-implemented method for designing a three-dimensional modeled object, wherein the method comprises the steps of:
  user-interacting with a screen;
  defining a stroke corresponding to the user-interacting;
  discretizing the stroke into a set of points;
  projecting the set of points onto at least one support in a three-dimensional scene;
  constructing the three-dimensional modeled object from the projected set of points and the said at least one support.

20 Claims, 7 Drawing Sheets

(56) References Cited

U.S. PATENT DOCUMENTS

| | | | |
|---|---|---|---|
| 7,613,539 | B2 | 11/2009 | Bae et al. |
| 7,696,998 | B2* | 4/2010 | Bae .......................... 345/441 |
| 8,259,101 | B2 | 9/2012 | Shimada et al. |
| 8,429,174 | B2 | 4/2013 | Ramani et al. |
| 8,773,431 | B2 | 7/2014 | Joshi et al. |
| 8,878,841 | B2 | 11/2014 | Letzelter |
| 8,941,681 | B2 | 1/2015 | Letzelter |
| 9,111,053 | B2 | 8/2015 | Letzelter et al. |
| 9,235,656 | B2 | 1/2016 | Letzelter |
| 9,245,060 | B2 | 1/2016 | Letzelter |
| 2003/0025694 | A1 | 2/2003 | Davis |
| 2004/0187714 | A1* | 9/2004 | Napadensky ........... B29C 41/48 101/35 |
| 2004/0249809 | A1 | 12/2004 | Ramani et al. |
| 2006/0082571 | A1* | 4/2006 | McDaniel .................... 345/419 |
| 2007/0265727 | A1* | 11/2007 | Bae ......................... G06F 17/50 700/182 |
| 2007/0276214 | A1* | 11/2007 | Dachille et al. ............. 600/407 |
| 2008/0036771 | A1 | 2/2008 | Bae |
| 2009/0284550 | A1* | 11/2009 | Shimada ............ G06F 17/5095 345/619 |
| 2010/0007664 | A1* | 1/2010 | Cao ............................. 345/443 |
| 2011/0084692 | A1 | 4/2011 | Billeres et al. |
| 2012/0280981 | A1 | 11/2012 | Letzelter |
| 2012/0280982 | A1 | 11/2012 | Letzelter |
| 2012/0280983 | A1 | 11/2012 | Letzelter |
| 2012/0280984 | A1 | 11/2012 | Letzelter et al. |
| 2012/0283998 | A1 | 11/2012 | Letzelter |

FOREIGN PATENT DOCUMENTS

| | | |
|---|---|---|
| JP | 08-194840 | 7/1996 |
| JP | 09-330426 | 12/1997 |
| JP | 2010-277460 | 12/2010 |
| WO | WO 2007/098243 A2 | 8/2007 |
| WO | WO 2007/146069 A2 | 12/2007 |
| WO | WO 2008/103775 A2 | 8/2008 |

OTHER PUBLICATIONS

Igarashi, Takeo, et al., "Teddy: A Sketching Interface for 3D Freeform Design", *Computer Graphics Proceedings, SIGGRAPH 99*, pp. 409-416 (Aug. 8, 1999).
Eric Keller, "Tutorial 4: Paintfx—Plasma Membrane Animation Techniques", pp. 1-21 (Dec. 29, 2009).
Duncan Brinsmead, "A Ribbon With Twist Control.pdf", Duncan's Corner, pp. 1-3 (Feb. 13, 2007).
Anonymous, "Exterior Algebra", Wikipedia (accessed on Apr. 2011).
Anonymous, "Bivector", Wikipedia (accessed on May 6, 2011).
Eric Keller, "Paint Effects and Toon Shading", Chapter 8, *Mastering Autodesk Maya 2011: Autodesk Official Training Guide*, pp. 417-469 (Sep. 7, 2010).
Olsen L., et al., "Sketch-Based Modelling: A Survey", *Computers and Graphics*, Elsevier, Gb, 33(1):85-103 (Feb. 1, 2009).
Mizuno S., "A Method to Create Sculptures With Chinkin in the Virtual Space", Virtual Systems and Multimedia (VSMM), 2010 16th International Conference on, IEEE, Piscataway, NJ, pp. 215-222 (Oct. 20, 2010).
European Search Report in European Patent Application No. 11305564.4 dated Jan. 26, 2012.
Agrawal, M., et al., "Context Aware 1-14 On-line Diagramming Recognition", *Frontiers in Handwriting Recognition (ICFHR), 2010 International Conference on, IEEE*, pp. 682-687 (2010).
Anonymous, "Nemetschek Campus Allplan 2005. Step by 1-14 Step. Advanced 3D", [Online] Retrieved from the Internet URL:http://bim.allplan.si/literatura/2005/Step%20by%20Step%20Allplan%202005%20-%20Advanced%203D.pdf [retrieved on Feb. 3, 2010] (2005) p. 126-p. 140.
Anonymous: "Centroid", Retrieved from the Internet URL:http://en.wikipedia.org/w/index.php?title=Special:Book&bookcmd=download&collection_id=4c6921d7317ebb1b&writer=rl&return_to=Centroid [retrieved on Aug. 23, 2011] pp. 1-14.
Baudel, T., "A Mark Based Interaction Paradigm for Free-Hand Drawing," *LRI, Université de Paris-Sud, CNRS URA 410 France.* (1994).
Eggli, et al., "Inferring 3D Models from Freehand Sketches and Constraints," *Computer Aided Design*, 29(2): 101-112 (1997).
European Search Report for 11 30 5545, dated Aug. 29, 2011.
European Search Report for 11 30 5546, dated Aug. 25, 2011.
European Search Report for 11 30 5547, dated Dec. 20, 2011.
European Search Report for 11 30 5548, dated Sep. 2, 2011.
European Search Report for 11 30 5549, dated Sep. 9, 2011.
Igarashi, T., et al., "A Suggestive Interface for 3D Drawing," [Online] Retrieved from the Internet: URL:http://delivery.acm.org/10.1145/1290000/1281531/a20-igarashi.pdf?ip=145.64.134.245&CFID=40190234&CFTOKEN=26502069&_acm_=1314782992 a, pp. 1-9 (2007).
Kara, L.B. and Stahovich, T.F., "An Image-Based, Trainable Symbol Recognizer for Hand-Drawn Sketches," *Computer Graphics*, 29;501-517 (2005).
McCrae, J.P., "Sketch-Based Path Design," pp. I-52 (2008). [Online] Retrieved from the internet:URL:http://www.dgp. [retrieved on Dec. 19, 2011].
Mohamed, K.A., "Concepts and Solutions for Efficient Handling of the Digital Ink," Retrieved from the Internet:URL:http://www.freidok.uni-freiburg.de/volltexte/7361/pdf/thesis final khaireel a mohamed Mar. 2010.pdf—[retrieved on Dec. 19, 2011]. Abstract Only.
Qin, S. F., et al., "From on-line Sketching to 2D and 3D Geometry: A System Based on Fuzzy Knowledge," Computer Aided Design, 32(14): 851-866 (2000).
Xiangyu, et al., "On-line Graphics Recognition," *Proceedings of the 10th Pacific Conference on Computer Graphics and Applications* (2002).
Zeleznik, R.C., et al., SKETCH: An Interface for Sketching 3D Scenes, *Computer Graphics Proceedings, Annual Conference Series*, 163-169 (1996).
Zhiquan Zhou, et al. "SS-Based Sketch Recognition for Graphics of Traffic Accident," Fuzzy Systems and Knowledge Discovery, 2010 *Seventh International Conference on Fuzzy Systems and Knowledge Discovery*, IEEE, 2558-2562.
Unisys—GEOPACK, Feb. 1991.
Japanese Patent Application No. 2012-108466, Official Notice of Rejection dated Nov. 10, 2015.
Yingkui et al., "Implicit Mapping Mechanism in Pen-Based Three-Dimensional Modeling System," *Journal of Beijing University of Aeronautics and Astronautics* vol. 32 No. 5 pp. 603-606 (May 2006).
"3D Studio Max—Tutorial—How to select and deselect / unselect one or more objects", youtube, Feb. 5, 2011, Retrieved from https://www.youtube.com/watch?v=0HcpD7MV3ZM on Dec. 20, 2017.

* cited by examiner

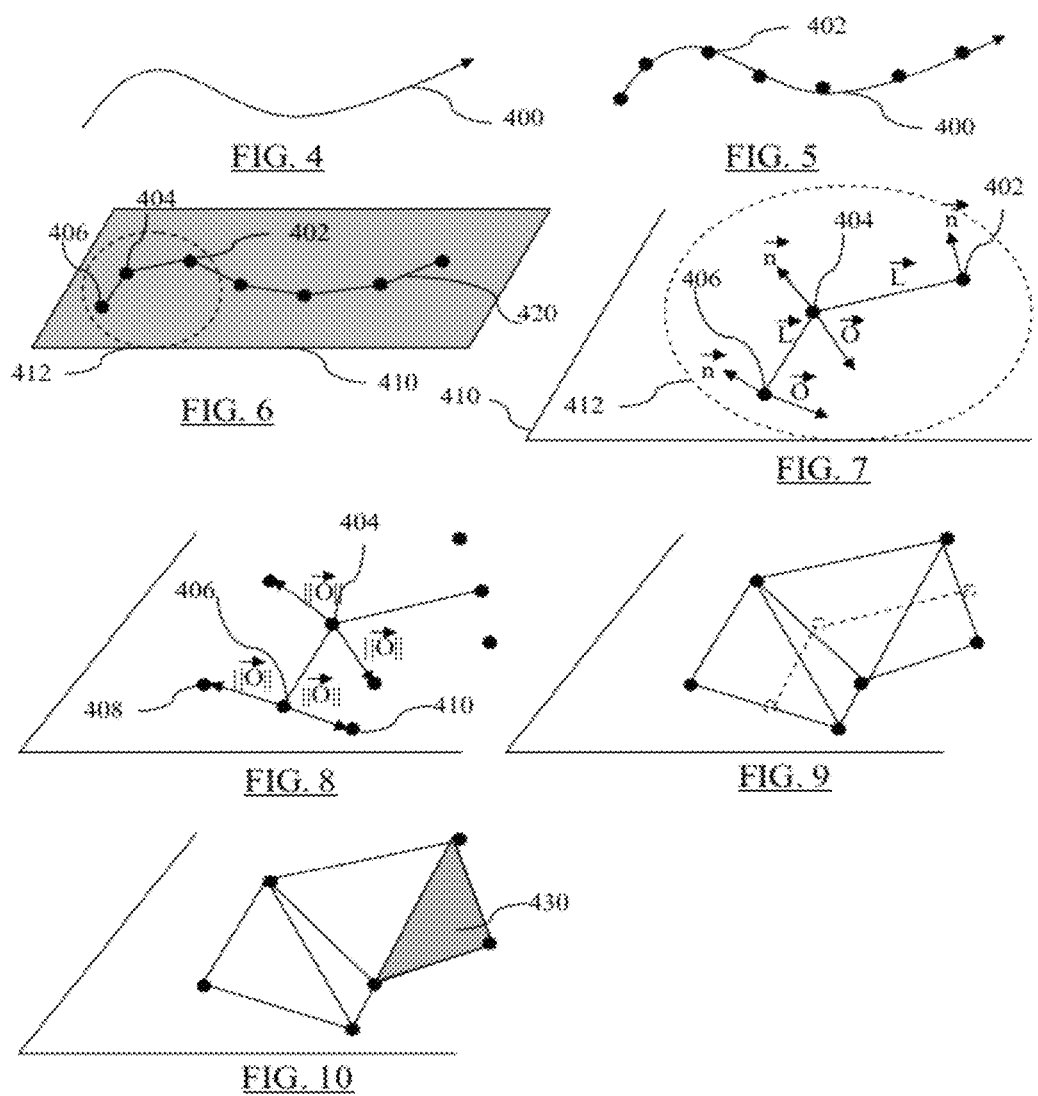

METHOD FOR DESIGNING A GEOMETRICAL THREE-DIMENSIONAL MODELED OBJECT

RELATED APPLICATION(S)

This application claims priority under 35 U.S.C. § 119 or 365 to European Patent Application No. 11305564.4, filed May 11, 2011.

The entire teachings of the above application(s) are incorporated herein by reference.

FIELD OF THE INVENTION

The invention relates to the field of computer programs and systems, and more specifically to a method, system and program for designing a geometrical three-dimensional modeled object.

BACKGROUND

A number of systems and programs are offered on the market for the design, the engineering and the manufacturing of objects. CAD is an acronym for Computer-Aided Design, e.g. it relates to software solutions for designing an object. CAE is an acronym for Computer-Aided Engineering, e.g. it relates to software solutions for simulating the physical behavior of a future product. CAM is an acronym for Computer-Aided Manufacturing, e.g. it relates to software solutions for defining manufacturing mes and operations. In such computer-aided design systems, the graphical user interface plays an important role as regards the efficiency of the technique. These techniques may be embedded within Product Lifecycle Management (PLM) systems. PLM refers to a business strategy that helps companies to share product data, apply common processes, and leverage corporate knowledge for the development of products from conception to the end of their life, across the concept of extended enterprise.

The PLM solutions provided by Dassault Systemes (under the trademarks CATIA, ENOVIA and DELMIA) provide an Engineering Hub, which organizes product engineering knowledge, a Manufacturing Hub, which manages manufacturing engineering knowledge, and an Enterprise Hub which enables enterprise integrations and connections into both the Engineering and Manufacturing Hubs. All together the system delivers an open object model linking products, processes, resources to enable dynamic, knowledge-based product creation and decision support that drives optimized product definition, manufacturing preparation, production and service.

The design of an object refers to the process of creating a shape of this object in three-dimension before creating a mock-up of the object. For instance, when a new car is thought, one of the important tasks is to create the body of the car. In general, the creation of a new object and its shape starts with a paper phase in which the designer of the object draws the object. The drawing comprises two steps. The first step is a sketch step wherein a rapidly executed freehand drawing that is not intended as a finished work is created. The second step is a tracer step wherein a definitive drawing of the object is designed from the sketch.

The sketch step is generally performed on paper, and the tracer step is then performed with dedicated software. The software Freestyle Sketch Tracer (Trademark) provided by Dassault Systemes allows the integration of stylists' work (such as 2D painting made at the sketch step) into a 3D format, as the basis for 3D virtual mockup. This product provides an intuitive toolbox for helping the designer to convert 2D data into 3D data: the designer first positions and scales a 2D image in 3D space, then draw the geometry over the sketches. In practice, the designer uses at least a 2D front view and a 2D side view of the object placed in the 3D space, and switch from the front view to the side view (and inversely) for placing points in the 3D space. Then, curves and surfaces are computed from the points until solids can be deduced.

This method for designing a three-dimensional modeled object however suffers several drawbacks. Firstly, the sketch and tracer steps are not integrated inasmuch as the sketch is still performed on paper and requires importing the drawings in the software. Secondly, the imported drawings are only 2D drawings, and therefore the geometrical curves are inferred from the imported 2D drawings. Thirdly, the creation of the 3D modeled object requires heavy computing resources because several computations are requires for computing the geometrical curves.

Within this context, there is still a need for an improved method for designing a geometrical three-dimensional modeled object.

SUMMARY OF THE INVENTION

According to one aspect, the invention therefore provides a computer-implemented method for designing a three-dimensional modeled object, wherein the method comprises the steps of:
 user-interacting with a screen;
 defining a stroke corresponding to the user-interacting;
 discretizing the stroke into a set of points;
 projecting the set of points onto at least one support in a three-dimensional scene;
 constructing the three-dimensional modeled object from the projected set of points and the said at least one support.

The method may comprise one or more of the following:
 a step of constructing a visualization of the three-dimensional modeled object by:
 computing, for each point of the projected set of points, at least two offset points, an offset point being a point positioned on said at least one support and spaced from said each point; and
 computing a surface delineated by the computed at least two offset points, the surface comprising the projected set of points;
 the computing of at least two offset points comprises:
 computing a poly-line linking the points of the projected set of points;
 computing, for each point of the projected set of points, an offset vector $\vec{O} = \alpha \ast (\vec{n} \wedge \vec{L})$, wherein $\alpha$ is a coefficient, $\vec{n}$ is a unit vector normal to the support, $\vec{L}$ is a vector defined by a line linking two points of the set of points forming the polyligne, $\vec{n}$ and $\vec{L}$ having as common origin the said each point;
 determining the said at least two offset points from the offset vector $\vec{O}$; and
 projecting the determined said at least two offset points onto said at least one support in a three-dimensional scene;
 a step of tessellating said computed surface delineated by the computed offset;

the step of constructing the visualization further comprises applying a shader for rendering said computed surface;

the steps of the method are repeated with at least another one support in the three-dimensional scene;

The invention further proposes a computer-implemented method for designing a three-dimensional geometrical modeled object, the method comprising the steps of:

provniding a set of three-dimensional modeled objects designed according to the method of the invention;

extracting the points of the provided set of three-dimensional modeled objects:

computing a geometrical smooth curve from the extracted points;

constructing a three-dimensional geometrical modeled object from the geometrical smooth curve.

The method for designing a three-dimensional geometrical modeled object may comprise one or more of the following:

at the step of extracting, the points are extracted according to the support on which the points are projected;

the step of extracting further comprises:

user-interacting with the screen;

defining a stroke corresponding to the user-interacting;

retrieving, among the extracted points, one of three-dimensional modeled objects of the provided set of three-dimensional modeled object and at least one support of said one of three-dimensional modeled objects retrieved;

discretizing the stroke corresponding to the user-interacting into a set of points;

projecting the points of the set of points onto the said at least one retrieved support;

the step of retrieving further comprises retrieving the closest three-dimensional modeled object from a pick path starting from a cursor;

the pick path comprises a ray cast from the cursor;

the steps of extracting, computing and constructing are repeated for each provided three dimensional modeled objects;

the steps of extracting, computing and constructing are repeated while the user interacts with the screen.

The invention further proposes a computer program comprising instructions for execution by a computer, the instructions comprising means for performing the methods of the invention.

The invention further proposes a computer readable storage medium having recorded thereon the above computer program.

BRIEF DESCRIPTION OF THE DRAWINGS

Embodiments of the invention will now be described, by way of non-limiting examples, and in reference to the accompanying drawings, where:

FIGS. 4-12 show an illustration of the method for designing a geometrical three-dimensional modeled object according to the invention.

DETAILED DESCRIPTION OF THE INVENTION

Figure 1:
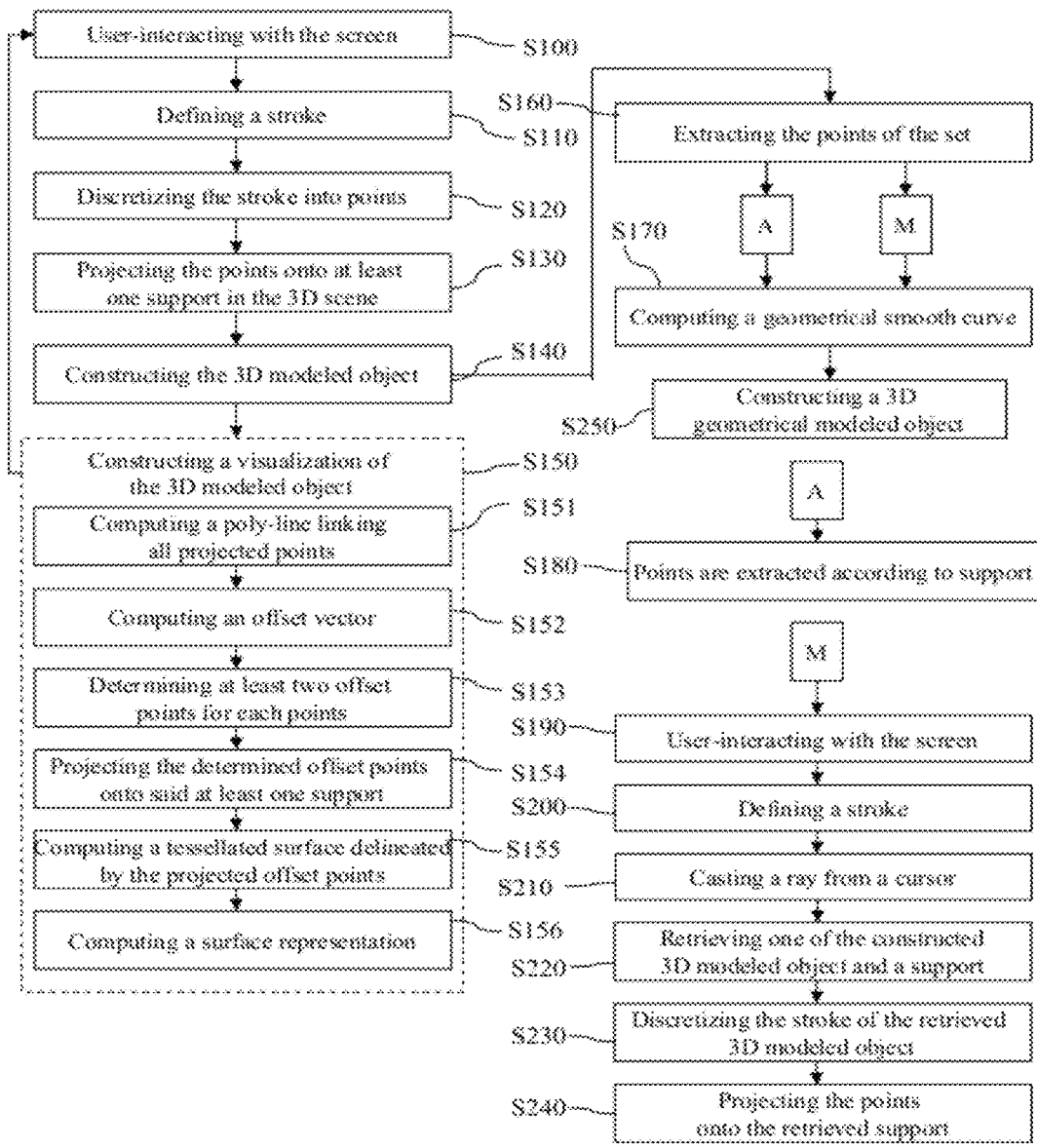
FIG. 1 shows a flowchart of an example of the method.

It is proposed a computer-implemented method for designing a three-dimensional modeled object. The method comprises a step of user-interacting with a screen. The method also comprises a step of defining a stroke corresponding to the user-interacting. The method also comprises a step of discretizing the stroke into a set of points. The method also comprises a step of projecting the set of points onto at least one support in a three-dimensional scene. The method also comprises a step of constructing the three-dimensional modeled object from the projected set of points and the said at least one support.

The method is for designing a three-dimensional modeled object. "Designing a three-dimensional modeled object" designates any action or series of actions which is at least part of a process of elaborating a three-dimensional modeled object. Thus, the method may comprise creating the three-dimensional modeled object from scratch. Alternatively, the method may comprise providing a three-dimensional modeled object previously created, and then modifying the three-dimensional modeled object.

The method may be included in computer-implemented method for designing a three-dimensional geometrical modeled object. The method comprises a step of providing a set of three-dimensional modeled objects designed according to the method for designing a three-dimensional modeled object. The method also comprises a step of extracting the points of the provided set of three-dimensional modeled objects. The method also comprises a step of computing a geometrical smooth curve from the extracted points. The method also comprises a step of constructing a three-dimensional geometrical modeled object from the geometrical smooth curve.

The method for designing a three-dimensional modeled object makes easier and faster the constructing of complex three-dimensional modeled objects and highly decreases the computing resources (e.g. CPU, memory) required for constructing a three-dimensional modeled object. The method for designing a three-dimensional modeled object also makes the method for designing a three-dimensional geometrical modeled object easier and faster and thus increases productivity of the designing process.

The method is computer-implemented. This means that the steps (or substantially all the steps) of the method are executed by at least one computer. In examples, the triggering of at least some of the steps of the method may be performed through user-computer interaction. The level of user-computer interaction required may depend on the level of automatism foreseen and put in balance with the need to implement the user's wishes. In examples, this level may be user-defined and/or pre-defined.

For instance, the step of interacting with a screen is one example of a step where the user intervenes.

A typical example of computer-implementation of the method is to perform the method with a system comprising a graphical user interface (GUI) suitable for this purpose. The GUI is coupled with a memory and a processor. The memory, which stores a database, is merely any hardware suitable for such storage. Such a system improves the design of three-dimensional modeled objects and three-dimensional geometrical modeled objects. Such a system may thus be used by a wide array of users, including specialist designers. For example, the steps which involve the user are performed through the GUI (comprising a screen for user-interaction with it), while the fully computerized steps are performed by the processor accessing the memory, without involvement of the GUI.

The information stored in the memory (i.e. three-dimensional parametric shape(s)) may be stored in the form of a database. By "database", it is meant any collection of data (i.e. information) organized for search and retrieval. When stored on a memory, the database allows a rapid search and retrieval by a computer. Databases are indeed structured to facilitate storage, retrieval, modification, and deletion of data in conjunction with various data-processing operations. The database may consist of a file or set of files that can be broken down into records, each of which consists of one or more fields. Fields are the basic units of data storage. Users may retrieve data primarily through queries. Using keywords and sorting commands, users can rapidly search, rearrange, group, and select the field in many records to retrieve or create reports on particular aggregates of data according to the rules of the database management system being used.

In the case of the methods, the database may comprise a set of three-dimensional modeled object used for designing a three-dimensional geometrical modeled object. Of course, the database may store the three-dimensional geometrical modeled objects designed according to the method.

The method and system generally manipulate modeled objects. A modeled object is any object defined by data stored in the memory. By extension, the expression "modeled object" designates the data itself. According to the type of the system, the modeled objects may be defined by different kinds of data.

A CAD system is any system suitable at least for designing a modeled object on the basis of a graphical representation of the modeled object, such as CATIA. Thus, the data defining a CAD modeled object comprise data allowing the representation of the modeled object (e.g. geometric data, for example including relative positions in space). A CAD modeled object is also referred to as a geometrical modeled object, and a three-dimensional CAD modeled object is also referred to as three-dimensional geometrical modeled object. A CAD system may for example provide a representation of CAD modeled objects using edges or lines, in certain cases with faces or surfaces. Lines, edges, or surfaces may be represented in various manners, e.g. non-uniform rational B-splines (NURBS). Specifically, a CAD file may contain specifications, from which geometry may be generated, which in turn allows for a representation to be generated. Specifications of a modeled object may be stored in a single CAD file or multiple ones. The typical size of a file representing a modeled object in a CAD system is in the range of one Megabyte per part. And a modeled object may typically be an assembly of thousands of parts.

A CAD system may also provide a representation of modeled objects using pixel-based geometry. A pixel-based geometry modeled object (referred hereinafter to as modeled object) uses pattern of pixel for ordering pixels. Lines, edges, or surfaces may be represented by pixel-based geometry. Specifically, a CAD file may contain specifications, from which pixels may be generated, which in turn allows for a representation to be generated. Specifications of the modeled object may be stored in a single CAD file or multiple ones. It has to be understood that a pixel-based geometry modeled object is an object without properties defined by mathematical equations, conversely to a geometrical modeled object.

The system may also be a CAE and/or CAM system, and the CAD modeled object may also be a CAE modeled object and/or a CAM modeled object. Indeed, CAD, CAE and CAM systems are not exclusive one of the other, as a modeled object may be defined by data corresponding to any combination of these systems.

In the context of CAD, a modeled object may typically be a 3D modeled object, e.g. representing a product such as a part or an assembly of parts, or possibly an assembly of products. By "3D modeled object", it is meant any object which is modeled by data allowing its 3D representation. A 3D representation allows the viewing of the part from all angles. For example, a 3D modeled object, when 3D represented, may be handled and turned around any of its axes, or around any axis in the screen on which the representation is displayed. This notably excludes 2D icons, which are not 3D modeled. The display of a 3D representation facilitates design (i.e. increases the speed at which designers statistically accomplish their task). This speeds up the manufacturing process in the industry, as the design of the products is part of the manufacturing process.

A CAD system may be history-based. In this case, a geometrical modeled object is further defined by data comprising a history of geometrical features. A geometrical modeled object may indeed be designed by a physical person (i.e. the designer/user) using standard modeling features (e.g. extrude, revolute, cut, and/or round etc.) and/or standard surfacing features (e.g. sweep, blend, loft, fill, deform, smoothing and/or etc.). Many CAD systems supporting such modeling functions are history-based system. This means that the creation history of design features is typically saved through an acyclic data flow linking the said geometrical features together through input and output links. The history based modeling paradigm is well known since the beginning of the 80's. A geometrical modeled object is described by two persistent data representations: history and B-rep (i.e. boundary representation). The B-rep is the result of the computations defined in the history. The shape of the part displayed on the screen of the computer when the geometrical modeled object is represented is (a tessellation of) the B-rep. The history of the part is the design intent. Basically, the history gathers the information on the operations which the geometrical modeled object has undergone. The B-rep may be saved together with the history, to make it easier to display complex parts. The history may be saved together with the B-rep in order to allow design changes of the part according to the design intent.

By PLM system, it is meant any system suitable for the management of a modeled object representing a physical manufactured product. In a PLM system, a modeled object is thus defined by data suitable for the manufacturing of a physical object. These may typically be dimension values and/or tolerance values. For a correct manufacturing of an object, it is indeed better to have such values.

By CAE system, it is meant any system suitable for the analysis of the physical behaviour of a geometrical modeled object. In a CAE system, a modeled object is thus defined by data suitable for the analysis of such behaviour. This may be typically a set of behavioring features. For instance, a modeled object corresponding to a door may be defined by data indicating that the door rotates around an axis.

Figure 2:
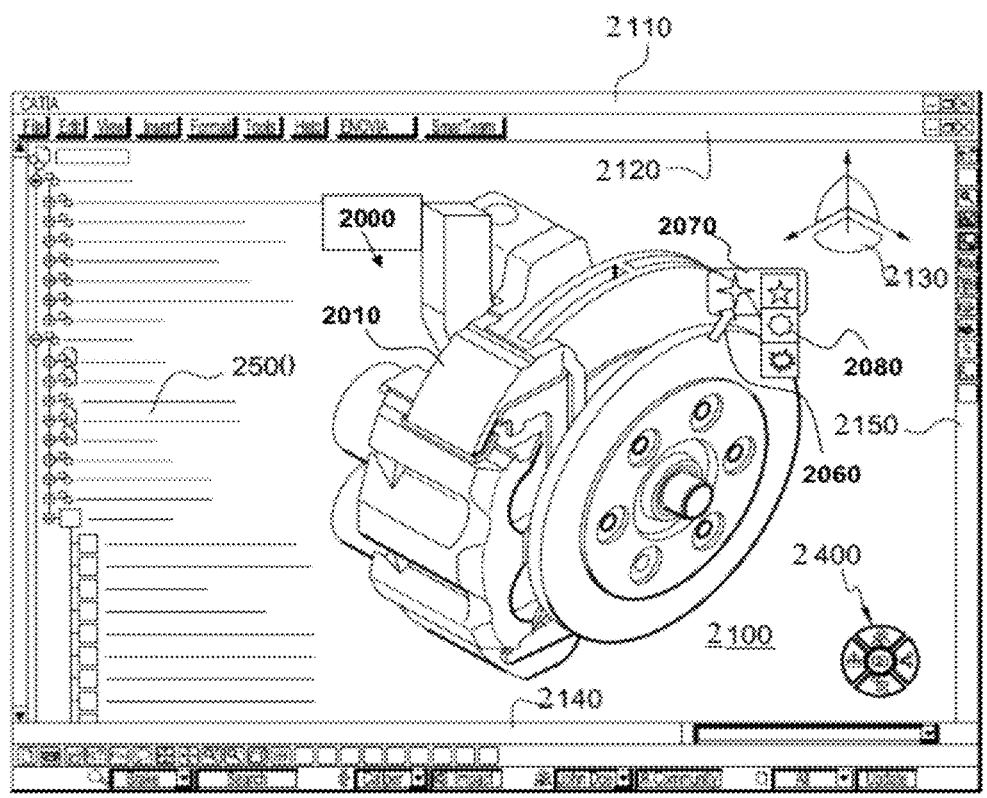
FIG. 2 shows an example of a graphical user interface.

FIG. 2 shows an example of the GUI of the system, wherein the system is a CAD system.

The GUI 2100 may be a typical CAD-like interface, having standard menu bars 2110, 2120, as well as bottom and side toolbars 2140, 2150. Such menu- and toolbars contain a set of user-selectable icons, each icon being associated with one or more operations or functions, as known in the art. Some of these icons are associated with software tools, adapted for editing and/or working on the 3D modeled object 2000 displayed in the GUI 2100. The software tools may be grouped into workbenches. Each workbench comprises a subset of software tools. In particular, one of the workbenches is an edition workbench, suitable for editing geometrical features of the modeled product

2000. In operation, a designer may for example pre-select a part of the object 2000 and then initiate an operation (e.g. change the dimension, color, etc.) or edit geometrical constraints by selecting an appropriate icon. For example, typical CAD operations are the modeling of the punching or the folding of the 3D modeled object displayed on the screen.

The GUI may for example display data 2500 related to the displayed product 2000. In the example of FIG. 2, the data 2500, displayed as a "feature tree", and their 3D representation 2000 pertain to a brake assembly including brake caliper and disc. The GUI may further show various types of graphic tools 2130, 2070, 2080 for example for facilitating 3D orientation of the object, for triggering a simulation of an operation of an edited product or render various attributes of the displayed product 2000. A cursor 2060 may be controlled by a haptic device to allow the user to interact with the graphic tools.

Figure 3:
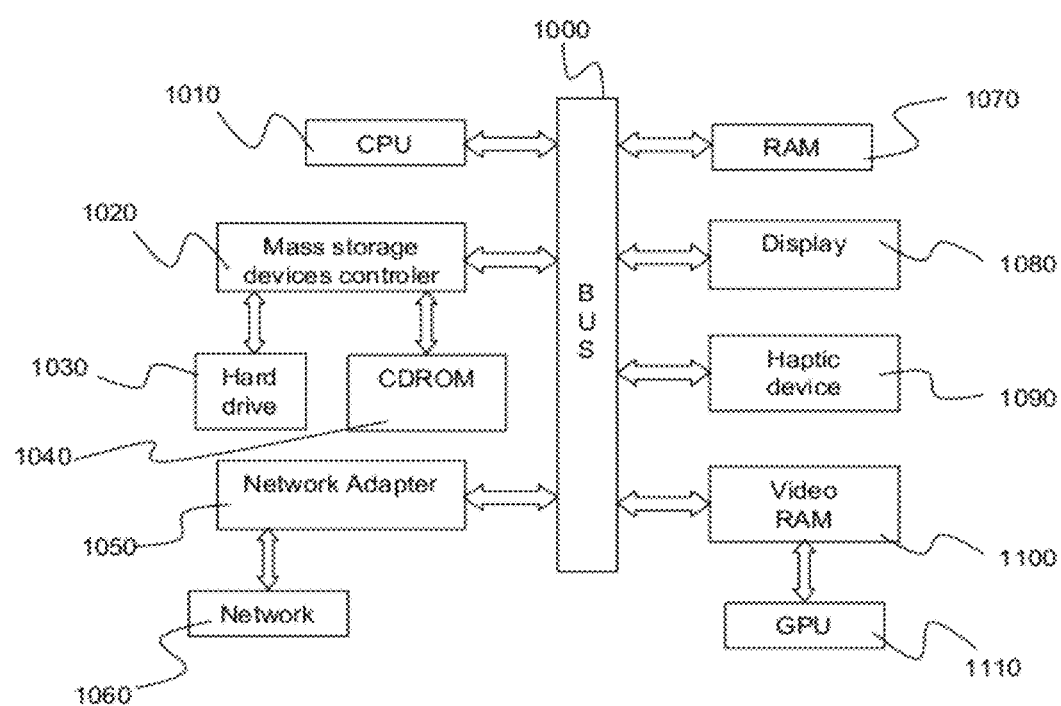
FIG. 3 shows an example of a client computer system.

FIG. 3 shows a client computer system, e.g. a workstation of a user.

The client computer comprises a central processing unit (CPU) 1010 connected to an internal communication BUS 1000, a random access memory (RAM) 1070 also connected to the BUS. The client computer is further provided with a graphical processing unit (GPU) 1110 which is associated with a video random access memory 1100 connected to the BUS. Video RAM 1100 is also known in the art as frame buffer. A mass storage device controller 1020 manages accesses to a mass memory device, such as hard drive 1030. Mass memory devices suitable for tangibly embodying computer program instructions and data include all forms of nonvolatile memory, including by way of example semiconductor memory devices, such as EPROM, EEPROM, and flash memory devices; magnetic disks such as internal hard disks and removable disks; magneto-optical disks; and CD-ROM disks 1040. Any of the foregoing may be supplemented by, or incorporated in, specially designed ASICs (application-specific integrated circuits). A network adapter 1050 manages accesses to a network 1060. The client computer may also include a haptic device 1090 such as cursor control device, a keyboard or the like. A cursor control device is used in the client computer to permit the user to selectively position a cursor at any desired location on display 1080, as mentioned with reference to FIG. 2. In addition, the cursor control device allows the user to select various commands, and input control signals. The cursor control device includes a number of signal generation devices for input control signals to system. Typically, a cursor control device may be a mouse, the button of the mouse being used to generate the signals.

A computer program may comprise instructions by a computer, the instructions comprising means for causing the above system to perform the above method. The invention may for example be implemented in digital electronic circuitry, or in computer hardware, firmware, software, or in combinations of them. Apparatus of the invention may be implemented in a computer program product tangibly embodied in a machine-readable storage device for execution by a programmable processor; and method steps of the invention may be performed by a programmable processor executing a program of instructions to perform functions of the invention by operating on input data and generating output.

The invention may advantageously be implemented in one or more computer programs that are executable on a programmable system including at least one programmable processor coupled to receive data and instructions from, and to transmit data and instructions to, a data storage system, at least one input device, and at least one output device. The application program may be implemented in a high-level procedural or object-oriented programming language or in assembly or machine language if desired; and in any case, the language may be a compiled or interpreted language.

Referring now to FIG. 1, a method for designing a three-dimensional geometrical modeled object is depicted.

At steps S100 to S150, a method for designing a three-dimensional modeled object is carried out. A three-dimensional modeled object is represented by data that are pixels (picture elements). The pixels are arranged together and form a pattern in a three-dimensional scene. For instance, a raster graphics image (also referred to as bitmap) is a data structure representing a generally rectangular two-dimensional grid of pixels. The raster image corresponds bit-for-bit with an image displayed on a screen.

In the present invention, the three-dimensional modeled object contains specifications that are pixels and from which pixels may be generated. The specifications of the three-dimensional modeled object allow representing the three-dimensional model object in a 3D scene. Importantly, properties of a 3D modeled object are not defined by mathematical equations.

At step S100, the user interacts with a screen. The user-interacting typically acts on areas of the screen. This may be done directly, e.g. if the screen is sensitive (for example a single-touch or multi-touch screen) and the user applies pressure on the screen, or indirectly, e.g. by using a haptic device such as a mouse, or a touchpad on which a user can apply a touch-pen. This could also be done by pointing a laser on the screen or any other way of interacting with the screen. A user-interacting through a touchpad or a sensitive screen makes the user-interacting more life-like (i.e. more similar to the traditional ideation phase where a specialist designer designs the object on paper). A life-like method for designing a 3D modeled object is an improvement as it helps specialist designers to use the CAD system. The design is thus easier.

Then, at step S110, a stroke is defined corresponding to the user-interacting. By user-interacting with the screen, the user activates some pixels of the screen. These pixels may be translated in a stroke, as known in the art. For example, if the user-interacting is performed through a pointing device or through a touch pen, the pixels activated correspond to the locations of the pointing device or the touch pen. These activated pixels may be dynamically displayed on the screen. The activated pixels may be translated in a stroke. Defining a stroke generally means locating positions on a screen which visually form a continuous line. These positions may indeed be displayed. This may be done for example by keeping track of the position of at least some of the pixels activated on the screen. Thus, the stroke corresponds to the user-interacting in the sense that it is derived from what is sketched by the user through the user-interacting. Thus, in a sense, the stroke is sketched by the user through the user-interacting.

Referring now to FIG. 4, a stroke 400 obtained upon user-interaction is represented. The stroke can be displayed to the user, e.g. on the screen, or not.

Referring back to FIG. 1, at step S120, the stroke is discretized into a set of points. Discretizing the stroke means sampling the stroke, for example by reducing the stroke to a number of points which are called the "stroke points" and form a set of points or a set of stroke points. As the stroke is a set of positions on the screen, discretizing the stroke thus means reducing (i.e. decreasing the number of) the set of positions to the sole stroke points.

Referring now to FIG. 5, the stroke represented on FIG. 4 is discretized into a set of points, e.g. the point 402.

Next, at step S130 of FIG. 1, the set of points is projected onto at least one support in a three-dimensional scene. The support may be a geometrical entity (visible or invisible) adapted for receiving a projected points. The support may act as a socle for the "stroke points". The support may for example be any kind of surface. Such surface may be a plane, for example the screen plane, or a curved surface, for example a sphere, or any other drawing surface. Indeed, a drawing surface different from the screen plane may be embedded in the (design area of the) screen. In other term, the support is geometrical entity in a three-dimensional space, e.g. the 3D scene. It is to be understood that several supports may be in the 3D scene. The supports form at least one surface on which the set of point can be projected.

The set of points is projected on the support(s). Projecting the set of points means that a transformation is applied on the "stroke points" so that the "stroke points" have positions on the support (when the support is different from the screen plane). As a result, the definition of the stroke is entirely life-like, the screen virtually corresponding here to the drawing paper (the paper being virtually orthogonally faced by the designer when the support is the screen plane). Consequently, a mapping is created between a two-dimensional plane, the screen on which a stroke is defined, and a surface in the three-dimensional scene, the support.

In practice, the viewpoint of the user is taken into account when projecting the set of points onto the support, as known in the art.

On FIG. 6, a plane support 410 is represented. The discretized points of the stroke have been projected of this plane support.

Then, at step S140 of FIG. 1, the 3D modeled object is constructed from the projected set of points and the support(s) onto which the set of points is projected. Constructing a three-dimensional modeled object means that the specifications of the three-dimensional modeled object are stored in a file or multiple ones. As a result, the constructed 3D modeled object may be stored, e.g. on a database, for a next use. The 3D modeled object is constructed with the projected "stroke points" and the support onto which the "stroke points" are projected. This involves that the positions of the projected "stroke points" are stored together with the data concerning the support. As a result, the construction step is step wherein computing are performed on data relative to the positions of the projected "stroke points" and the support. Advantageously, only the coordinates of the support in the 3D scene may be stored, thus improving the speed for constructing of the three-dimensional modeled and decreasing the computing resources required for constructing (or computing) the three-dimensional modeled object.

The support may be found back from the coordinates of the support in the 3D scene stored in the constructed 3D modeled object. The support may also be found back from the coordinates of the projected "stroke points": an average plane is computed via a covariance matrix and the computing of proper vectors. It is also possible to use the constructed modeled object as a support: it is used as a cloud of points. The constructed 3D modeled object becomes itself a support, for instance via a local tessellation of the points forming the constructed 3D modeled object.

The designing of the 3D modeled object according to the invention does limit the need of computing resources because any geometric curve needs to be computed: indeed, geometric modeled objects from which geometry is generated requires huge computing resources. Furthermore, less memory is required for storing a pixel based geometry constructed according to the invention than geometrical modeled object. In addition, the invention allows to create 3D modeled objects that cannot be (easily) obtained with a pure geometrical approach: indeed, the geometric representation needs to be relatively simple in order to limit the consumption of the computing resources. Thus, the invention increases flexibility in user-interacting with the screen inasmuch as computing resources does no more limit said user-interacting. A further advantage is that the constructed 3D modeled object respect reliably the design intend of the user. Indeed, there is any interpretation of the stroke defined by the user, and it is therefore reproduced as designed by the user. On the contrary, in a geometric environment (that is, with geometric modeled object), the geometric curves owns characteristics that modify the original design intend of the user. For instance, a Bezier curve of degree 5 does not allow the user to create an oscillating shape, which is allowed with a modeled object constructed according to the invention. The user has therefore the feeling that he/she is working in a freehand drawing environment, thus improving the ergonomy. It results that it is easier and faster to create a more accurate 3D drawing (e.g. a sketch).

At this step of the method, the 3D modeled object is constructed, which means that data representing the object can be exploited by a system, e.g. a CAD system. Therefore, a visualization of the three-dimensional modeled object can be constructed (step S150) for displaying the 3D modeled object designed. Constructing a visualization means that a graphical representation of the 3D modeled object is computed. Especially, the constructed visualisation is pixel-based, which involves that the representation 3D modeled object is only computed by the graphical processor unit, thus preserving computing resources of the CPU and memory.

Other advantages will be apparent thereafter.

The construction of the visualisation may comprise the computing, for each point of the projected set of points, at least two offset points (step S153). An offset point of a projected "stroke point" is a point that is positioned on the support(s) onto which the "stroke point" is projected and that is spaced from the projected "stroke point". The offset point is on the support, which means that the point belongs to the surface. The offset point is spaced from the projected "stroke point", which means that the offset point is distinct from the "stroke point".

The computing of the offsets points may be carried out as follow. First, at step S151, a poly-line is computed. The poly-line links the points of the set of points projected onto the support. A poly-line is a connected series of line segments wherein a line segment is a part of a line that is bounded by two projected "stroke point". It is to be understood that the line segments are connected so that the poly-line approximates the projection of the stroke on the support.

Referring now to FIG. 6, a poly-line 420 connecting the projected "stroke points" is displayed. As it is apparent, the poly-line approximates a projection (not represented) of the stroke 400 of FIG. 5 on the support 410.

Referring back to FIG. 1, at step S152, an offset vector is then computed for each projected "stroke point" onto the support. The offset vector may be noted $\vec{O} = \alpha * (\vec{n} \wedge \vec{L})$. $\alpha$ is a coefficient that can be chosen by the user, or by default by the system. This coefficient determines partly the distance between an offset point and the projected "stroke point"

from which the offset point is computed. Advantageously, the coefficient α allows to increase or decrease the thickness of the representation computed at step S156. $\vec{n}$ is a unit vector normal to the support from a projected "stroke point". $\vec{L}$ is a vector defined by a line linking two points of the set of points forming the polyligne. $\vec{n}$ and $\vec{L}$ have a common projected "stroke point" as origin. The product between $\vec{n}$ and $\vec{L}$ is a vectorial product.

The computing offset vector is more apparent in FIG. 7. Each point 402, 404, 406 is positioned on the support as the result of the projection step S130 and is associated with a normal vector $\vec{n}$. As depicted, a vector $\vec{L}$ linking the points 406 and 404 is determined and has the point 406 as origin. An offset vector $\vec{O}$ for the point 406 can therefore be computed with the relation $\vec{O}=\alpha*(\vec{n}\wedge\vec{L})$. Similarly, an offset vector $\vec{O}$ for the point 404 is computed from a vector $\vec{L}$ linking the points 404 and 402 and a normal vector, both having the point 404 as origin. In both cases, the coefficient α has been chosen such that α=1.

Referring back to FIG. 1, at least two offset points are determined (S153) from the offset vector $\vec{O}$ previously computed. The determination is performed by computing the norm of the vector $\|\vec{O}\|$, so that two points are identified. This is illustrated on FIG. 8 wherein the offsets points are obtained from the norm of the offsets vectors. For instance, the projected "stroke point" 406 has two offsets points 408, 410.

Then, the offset points are projected onto at least one support on the 3D scene (step S154). Preferably, the projection is performed when the support is not plane, or when several supports are involved during the projection of the "stroke points". The projection ensures that the offsets points are on the support(s), that is, the offsets points belong to the surface. It is to be understood that it is possible to project the "stroke points" onto any kind of support, thus improving the design possibilities for the user. For instance, the support may have a surface similar to crumpled paper, and it is possible to project the stroke on this crumpled surface.

Next, a surface is computed from the offset points (S155). The surface is delineated by the computed offset points and comprises the projected set of points (also referred to as projected "stroke points"). Delineating the surface means that a boundary of the surface is created by linking the offsets points. The offset points are linked one each other in a similar way as the projected "stroke points". As a result, two offset points may be linked only if their respective projected "stroke points" are linked. In addition, only the offset points located on a same side of the poly-line can be linked. Indeed, the poly-line divides (at least partially) the surface on which it is computed so that two sides are defined. It is to be understood that two supplementary poly-lines are built while linking the offset points together, the first supplementary poly-lines being located on a side of the poly-line comprising the projected "stroke points", and the second one on the other side.

The surface computed from the offset points is therefore a selected part of the surface forming the support(s) onto which the "stroke points" are projected. This computed surface may be place or curved. As a result, the computed surface reflects the topology of the support(s) and it is possible to grasp the how the computed surface changes in the 3D space.

In practice, the computed surface is tessellated (step S155). The constructed surface is a boundary of a topological model, and in order to facilitate the management and the rendering of the computed surface, it is approximated by a tessellation. The tessellation divides the computed surface into a mesh of small, easy-to-analyze pieces of 2D faces. Typically, the computed surface is tessellated into triangles generated from the offset points. One could also say that the surface is triangulated. The surface may be generated by a mesh generator, as known in the art. The result of a tessellation is shown on FIG. 9.

Then, at step S156, a representation of the tessellated surface is computed. This step comprises applying a shader for rendering the surface. A shader is small software comprising instructions from computing effects on graphics hardware, e.g. a graphical processor unit (GPU). A shader allows allowed only common geometry transformation and pixel-shading functions; a shader allows describing the traits of a pixel. In practice, a shader is applied on each piece of the 2D faces of the tessellated surface. The computed representations can be displayed by to the user, e.g. on the screen.

FIG. 10 illustrates a tessellated surface wherein only the triangle 430 has a shader applied on it—this triangle is represented in grey—.

Figure 13:
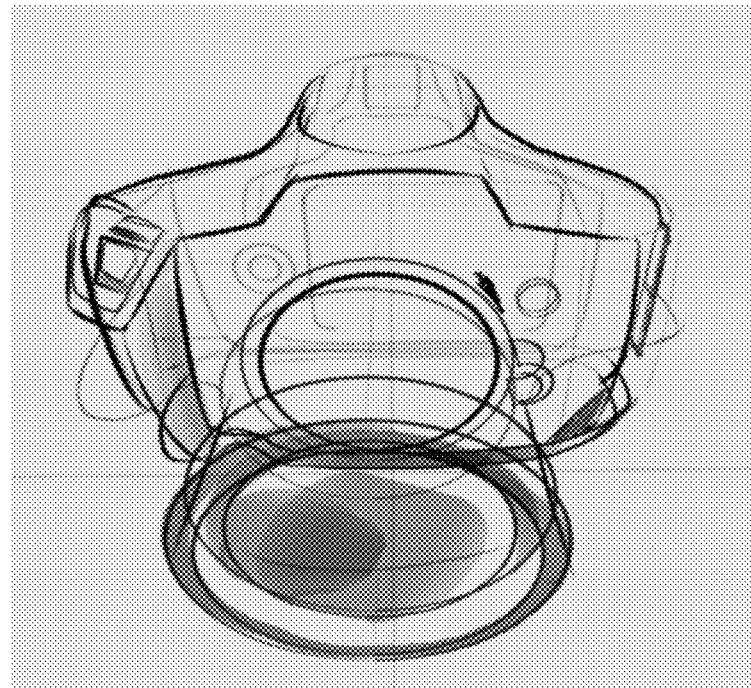
FIGS. 13-16 shown an illustration of the method for designing a three-dimensional modeled object according to the invention.
Figure 14:
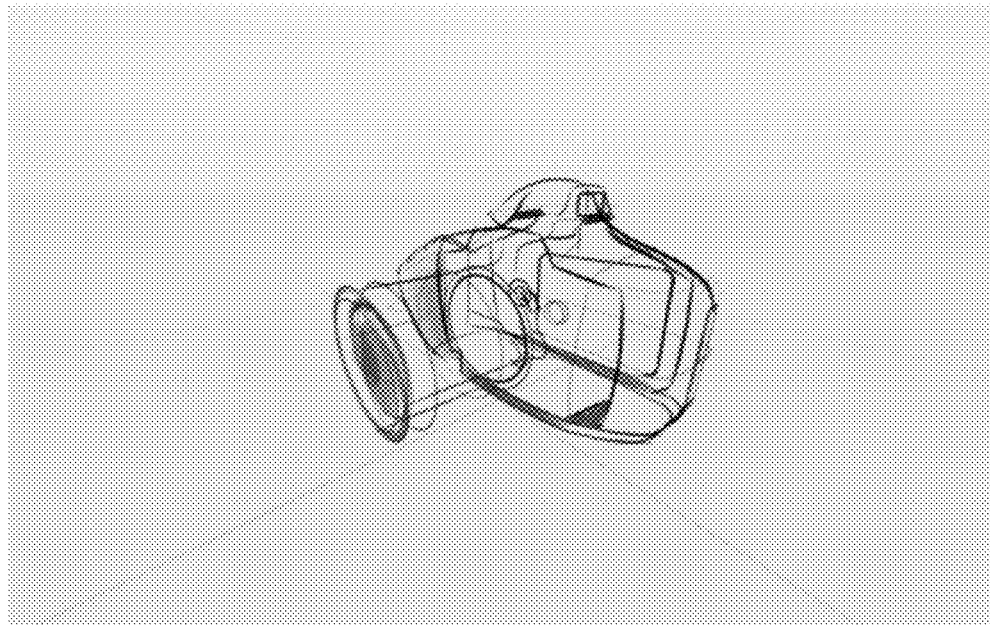
Figure 15:
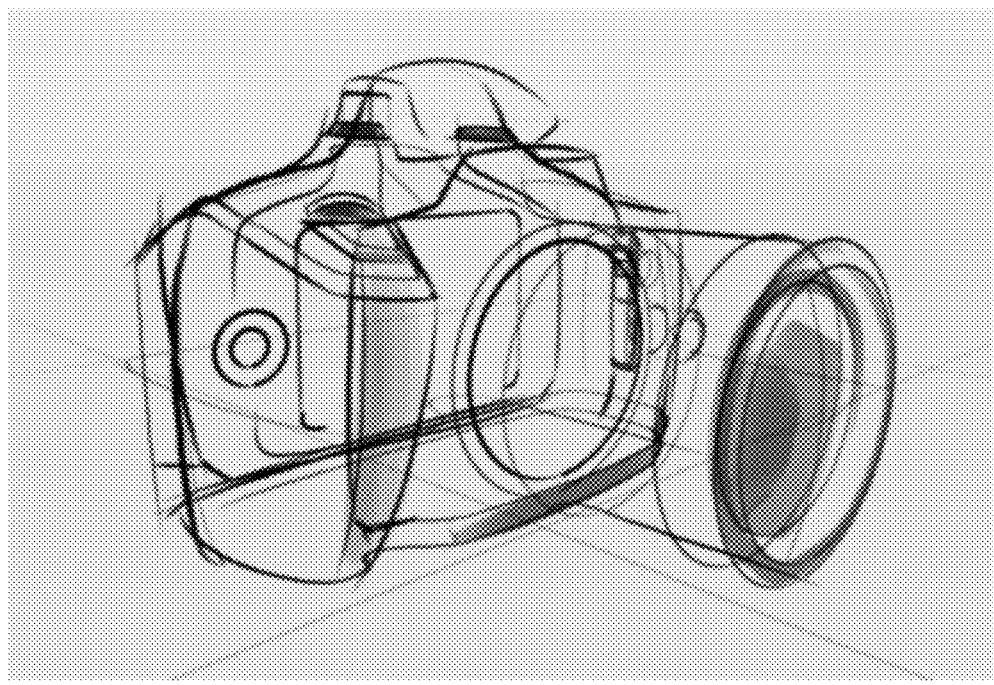
Figure 16:
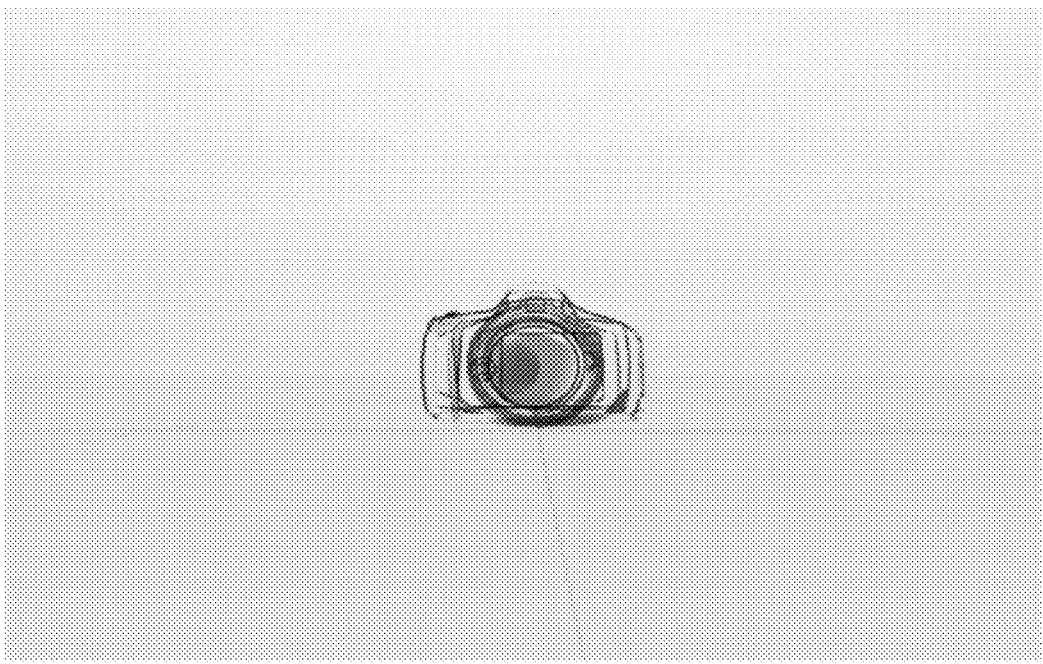

It is to be understood that the steps of the method can be repeated with at least one other support. The support can be selected by the user, or automatically selected. Thus, it is possible to construction several 3D modeled objects that can be parts of an object. In other term, the user can create several different views of a same object, as illustrated on FIGS. 13-16. On FIG. 13, the visualization of a 3D modeled object is shown. This 3D modelled object is the sketch of an object (here a camera) drawn by the user. This sketch has been constructed on a plane support and is representative of one of the viewpoint of the camera imagined by the user. On FIG. 14, another plane support has been selected by the user so that another visualization of the camera imagined by the user has been constructed, this visualization being representative of another viewpoint of the camera. Similarly, on FIGS. 15 and 16, two visualizations of two 3D modeled objects constructed on two different supports are shown and represent two other viewpoint of the camera. Thus, the user can step by step (that is, for each new selection of a support) trace the shape of on object and obtain a several visualisation of a same object according to several viewpoints.

In practice, the user can manipulate a support (e.g. a plane) in the 3D scene, each manipulation of the support creating therefore a new one. Manipulating a support means that the user moves the support in the 3D scene. This is performed as known in the art, e.g. the support is moved with a haptic device such as a mouse. As a result of the manipulation, a new support is selected. Advantageously, when the user manipulates the support, he/she may still see the visualisation of the 3D modeled object so that the user comprehends the new viewpoint.

In addition, the method allows defining 3D modeled objects on the same support. This allows the user to trace a complex object, e.g. a camera, the user sketching several strokes as he/she would do it on a paper sheet.

Advantageously, the visualization of the stroke defined by the user is surfacic, while such a representation is normally linear. In the classical approach, a set of poly-lines represents the object, while in the present invention, the object is tessellated, which allows to apply shaders (e.g. a shader may be applied on each triangle of the computed surface). As a result, several display options may be applied thanks to the shader (e.g. thickness, opaqueness, visual rendering such as graduated opaqueness . . . ).

At this step of the method, a pixel-based representation of the 3D modeled object has been constructed and displayed to the user. In other terms, a 3D pixel sketch is displayed. The user may now need to work on a geometrical 3D modeled object obtained from the 3D modeled object. For instance, the user may need to transform the 3D modeled object within a CAD system that can requires a CAD modeled object (also known as geometrical modeled objects).

The method for designing a 3D geometrical modeled object comprises a step of providing a set of 3D modeled objects designed as seen previously. This step is represented on FIG. 1 by the arrow linking the block S140 with the block S160. Providing a 3D modeled object means that a constructed 3D modeled object can be accessed by the system. Typically, a CAD system accesses a file comprising the specifications of the pixel-based geometry modeled object (that is, a 3D modeled object). The set of 3D modeled objects may be stored for instance on a database.

Once the system has accessed the set of 3D modeled objects, the points of the 3D modeled objects are extracted (step S160). These extracted points are the "stroke point" projected on the supports. In other term, the CAD system can access the respective position of each points located on the support. As previously mentioned, the support may be found back from the coordinates of the "stroke points".

Next, at step S170, a geometrical smooth curve is computed from the extracted points. A geometrical smooth curve is defined by a function from a closed interval to a Euclidean space such that each of the Cartesian coordinates of the image point is a continuously differentiable function on the closed interval. In other terms, a smooth curve is a continuous curve—no gaps or discontinuities—with no corners (that is, no abrupt changes in slope at a point such as the ones obtained the intersection of two lines). The computing of the smooth curve is performed as known in the art, e.g. a method of least square. As a result, a set of 3D modeled objects having a pixel-based geometry are transformed into at least one 3D geometrical modeled object having geometric data. Advantageously, non geometrical data are transformed into geometrical data on which specific algorithms can be applied. This allows to create 3D geometrical modeled objects that cannot be created from scratch in the CAD system because their creation from scratch would require too many computing resources. Thus, the construction of 3D geometrical modeled objects according to the method of the invention increases the design capabilities of the user and limits the consumption of computing resources of the system.

The transition from the extraction of points of the 3D modeled objects at step S160 to the computing of the geometrical curve at step S170 can be performed according to modes, a first mode called automatic extraction of a 3D geometrical modeled object noted on A on FIG. 1, and a second mode called manual extraction of a 3D geometrical noted on M on FIG. 1.

The automatic extraction mode computes the geometrical smooth curve (step S170) without any interaction between the CAD system and the user. This means that the user does not intervene while the system computes the smooth curve. The automatically extracted geometrical smooth curve is a curve that represents an average position for all the projected "stroke points". Advantageously, the automatic mode allows tracing a smooth curve that respects the design intend of the user without any action of the user. This increases the overall speed of the method for designing a geometrical 3D modeled object.

Figures 11, 12:
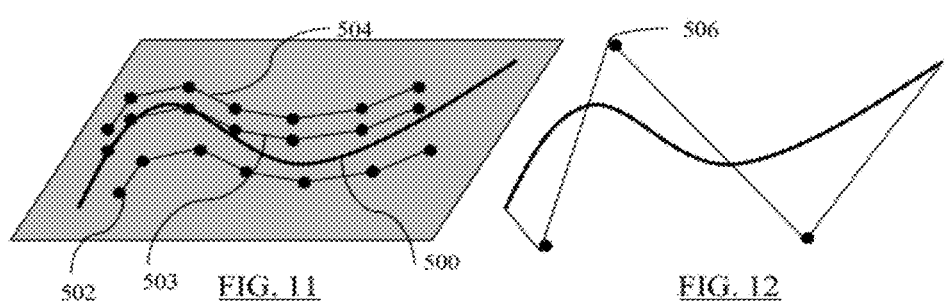

This is illustrated on FIG. 11. Three poly-lines 502, 503, 504 are shown. These poly-lines are constructed from the "stroke points" projected on a same support representative of the 3D modeled object provided at the step of providing a set of 3D modeled objects. The curve 500 represents the smooth curve computed from the projected "stroke points", that is, the geometrical 3D modeled object 500 represents the average curve of the set of poly-lines 502, 503, and 504.

In practice, the extraction of the points is carried out according to the support on which the points are projected. This amounts to say that a filtering of the extracted points is performed and the filtering is based on the support on which the extracted are projected. In other terms, a subset of the "stroke points" of 3D modeled objects that are projected on a same support is created. This allows to find out quickly the 3D modeled objects that are related.

In general, there is one 3D modeled object for one support, a 3D modeled object being constructed according to a support. However, a 3D modeled object may also be constructed according to two or more supports. Furthermore, two 3D modeled objects may have the same support, e.g. the user selects two times the same support.

In addition, the extraction of the points may be carried out according to the respective shape of the poly-line. This may be performed thanks to the structure storing the projected stroke points: each constructed 3D modeled object is characterized by points, and a number of points. Thus, extracting the points amounts to read the structure storing the projected stroke points. These poly-lines are constructed from the "stroke points" projected on a same support and being representative of the 3D modeled object provided at the step of providing a set of 3D modeled objects. A filtering is thus carried out for selecting projected "stroke points" of the 3D modeled objects forming sets of poly-lines and the filtering is based on the shape of the poly-lines. For instance, if two poly-lines have a similar shape while a third one has a complete different shape, then a first subset comprising the two poly-lines having the similar shape is created and a second subset comprising the third poly-line is created. As a result, a first geometrical smooth curve is computed from the points of the poly-lines of the first subset and a second geometrical smooth curve is computed for the points of the poly-lines of the second subset. This adventurously allows to trace geometrical smooth curves respecting the design intend of the user during the sketch phase. This filtering relies on the assumption that a user sketching several similar strokes intends to trace, in a further step, a clean line representing these strokes.

Next, a three-dimensional geometrical modeled object is constructed from the geometrical smooth curve (step 250). This means that the data defining the geometrical smooth curve comprise data allowing the representation of the smooth such as geometric data, for example including relative positions in space. In other term, a file that can be exploited by the CAD system is created. In addition, the file can be easily shared between several systems, e.g. systems that are connected through a computer networks.

It is to be understood that the extracting (S160), computing (S170) and constructing steps (S250) are repeated for each provided three dimensional modeled objects. This amounts to say that all the points of the provided 3D modeled object are extracted and almost all the extracted points are used for constructing 3D geometrical modeled objects. In other terms, it is possible to automatically obtain the 3D geometrical objects from the 3D modeled objects created by the designer. In other terms, the traces of an object may be automatically obtained after the sketching of this object by the user. Consequently, the speed for obtaining a "clean" object (that is, a trace of the object) is increased and the trace can be imported in a CAD system for further designing operations.

The manual extraction mode computes the geometrical smooth curve (step S170) upon interaction between the system (e.g. a CAD system) and the user. This means that the user acts with the system while the system computes the smooth curve. The geometrical smooth curve is therefore a curve that represents the interaction of the user with the system. In other terms, the user draws a curve that is intended to replace at least two 3D modeled objects. Consequently, the tracing phase fulfils the user's needs.

In practice, the user interacts with the screen (step S190) so that a stroke corresponding to the user-interacting is defined (S200). These steps are similar to the steps S100 and S110.

Then, one of three-dimensional modeled objects of the provided set of three-dimensional modeled object and at least one support of said one of three-dimensional modeled objects are retrieved among the extracted points. In other term, a 3D modeled object and a support(s) with which the 3D modeled object has been constructed are retrieved.

The retrieving can be performed by retrieving the closest three-dimensional modeled object from a pick path starting from a cursor, e.g. the cursor 2060 on FIG. 2 may be controlled by a haptic device that allows the user to interact within the graphical user interface. It is to be understood that the interaction of the user may be done directly, e.g. if the screen is sensitive (for example a single-touch or multi-touch screen) and the user applies pressure on the screen, or indirectly, e.g. by using a haptic device such as a mouse, or a touchpad on which a user can apply a touch-pen. This could also be done by pointing a laser on the screen or any other way of interacting with the screen. In the event the interaction of the user is done directly on the screen, the pick path starts from the location of the screen wherein the pressure is applied by the user.

The closest 3D modeled object is the 3D modeled object in the 3D scene having the smallest distance with the screen. In other term, the closest 3D modeled object is the object which is perceived as being the closest by the user. This facilitates the tracing operations for the user.

The pick path is the path intersecting the 3D modeled objects of the provided set. Pick path means that objects intersected by the path may be picked, that is, the objects may be selected individually. In other words, the pick path is the result of the intersection between a ray computed (near-far) at a screen location and the 3D modeled objects visualized in the 3D scene.

Retrieving means that the 3D modeled object stored in collection of data organized for search and retrieval (e.g. a database) is searched upon a query and provided as the result of the query.

In practice, the pick path may be implemented with a ray, e.g. using a technique of ray casting (S210). The pick path thus contains the list of the visualizations of 3D modeled objects intersected by the ray. The implementation of the pick path is not limited to the ray casting, and other method can be contemplated, e.g. volume ray casting. Ray casting is a solution known in the art for determining the first object intersected by the ray, that is, the closest object from de screen in the 3D scene. The ray is casts from the cursor, or from the location of the screen wherein a pressure is applied by the user on a touch sensitive screen. In the event the ray is cast from a cursor, the ray may be continuously cast. In the event the user interacts with the screen, e.g. the user touches the screen, a ray may be cast from the location of the screen wherein a pressure is applied.

It is to be understood that the retrieving of one of 3D modeled objects of the provided set and its support(s) can be performed by determining the closest support from a pick path starting from a cursor, and the 3D modeled object constructed with this support is also retrieved. In the event the support is shared by two or more 3D modeled objects, then these two or more objects are retrieved.

Next, once the retrieving step has been performed (and that a support has been retrieved), the stroke corresponding to the user-interacting is discretized into a set of points (S230). And then, the points of the set of points are projected (S240) onto the support retrieved at the step S220. It is to be understood that these steps S230 and 240 may be performed as well as the steps S120 and 130.

Next, a three-dimensional geometrical modeled object is constructed from the geometrical smooth curve (step 250). This is similarly performed as for the automatic extraction mode.

It is to be understood that the step of extracting according to the manual extraction mode (S180), computing (S170) and constructing are while the user interacts with the screen. In practice, these steps are repeated while strokes are defined upon user-interaction with the screen, which amounts to say while the user draws a curve that is intended to replace at least two 3D modeled objects.

Referring now to FIG. 12, a 3D geometrical modeled object obtained from the smooth curve 500 of FIG. 11 is displayed. This geometrical object can be manipulated in a CAD system, e.g. control point 506 may be used for modifying the curve.

The preferred embodiment of the present invention has been described. It will be understood that various modifications may be made without departing from the spirit and scope of the invention. Therefore, other implementations are within the scope of the following claims. For instance, the computing of the offsets points used for constructing a selection of a part of the surface of the support may be computed by determining a regular strip that extends from the poly-line formed by the projected "stroke points" with a distance (e.g. a number of pixels) determined by the user or the system.

The invention claimed is:

1. A computer-implemented method for designing an interactive three-dimensional modeled object, wherein the method comprises:

using one or more processors:
receiving user-interaction with a screen that represents a two-dimensional plane;
defining a stroke corresponding to the user-interaction with the screen;
discretizing the stroke into a set of points, each point having a position on the two-dimensional plane;
defining in a three-dimensional scene at least one support that is a surface on which the points of the discretized stroke can be projected, wherein a support of the at least one support is: (i) different from the two-dimensional plane of the screen, (ii) adapted for receiving points, and (iii) configured to be manipulated to create another support in the three-dimensional scene;
projecting the set of points of the discretized stroke onto said at least one support defined in the three-dimensional scene, wherein projecting the set of points accounts for a user viewpoint and each projected point of the set has a new position on the at least one support; and constructing the interactive three-dimensional modeled object from the projected set of points and a coordinate of the said at least one support in the three-dimensional scene.

2. The method of claim 1, further comprising a step of constructing a visualization of the three-dimensional modeled object by:

computing, for each point of the projected set of points, at least two offset points, an offset point being a point positioned on said at least one support and spaced from said each point; and computing a surface delineated by the computed at least two offset points, the surface comprising the projected set of points.

3. The method of claim 2, wherein the computing of at least two offset points comprises:

computing a poly-line linking the points of the projected set of points;

computing, for each point of the projected set of points, an offset vector $\vec{O}=\alpha*(\vec{n}\wedge\vec{L})$ wherein $\alpha$ is a coefficient, $\vec{n}$ is a unit vector normal to the at least one support, $\vec{L}$ is a vector defined by a line linking two points of the set of points forming the poly-line, $\vec{n}$ and $\vec{L}$ having as common origin the said each point;

determining the said at least two offset points from the offset vector $\vec{O}$; and projecting the determined said at least two offset points onto said at least one support in the three-dimensional scene.

4. The method of claim 2, further comprising a step of tessellating said computed surface delineated by the computed offset.

5. The method of claim 2, wherein the step of constructing the visualization further comprises applying a shader for rendering said computed surface.

6. The method of claim 1, wherein the steps of the method are repeated with at least another one support in the three-dimensional scene.

7. A computer-implemented method for designing an interactive three-dimensional geometrical modeled object, the method comprising the steps of:

using one or more processors:

providing a set of three-dimensional modeled objects designed by:

receiving user-interaction with a screen that represents a two-dimensional plane;

defining a stroke corresponding to the user-interaction with the screen;

discretizing the stroke into a set of points, each point having a position on the two-dimensional plane;

defining in a three-dimensional scene at least one support that is a surface on which the points of the discretized stroke can be projected, wherein a support of the at least one support is: (i) different from the two-dimensional plane of the screen, (ii) adapted for receiving points, and (iii) configured to be manipulated to create another support in the three-dimensional scene;

projecting the set of points of the discretized stroke onto said at least one support defined in the three-dimensional scene, wherein projecting the set of points accounts for a user viewpoint and each projected point of the set has a new position on the at least one support;

constructing the three-dimensional modeled objects from the projected set of points and a coordinate of the said at least one support in the three-dimensional scene;

extracting the points of the provided set of three-dimensional modeled objects;

computing a geometrical smooth curve from the extracted points; and constructing an interactive three-dimensional geometrical modeled object from the geometrical smooth curve.

8. The computer-implemented method of claim 7, wherein, at the step of extracting, the points are extracted according to the support on which the points are projected.

9. The computer-implemented method of claim 7, wherein the step of extracting further comprises:

user-interacting with the screen;

defining a stroke corresponding to the user-interacting with the screen;

retrieving, among the extracted points, one of three-dimensional modeled objects of the provided set of three-dimensional modeled objects and at least one support of said one of three-dimensional modeled objects retrieved;

discretizing the stroke corresponding to the user-interacting into a set of points;

projecting the points of the set of points onto the said at least one retrieved support.

10. The computer-implemented method of claim 9, wherein the step of retrieving further comprises retrieving the closest three-dimensional modeled object from a pick path starting from a cursor.

11. The computer-implemented method of claim 10, wherein the pick path comprises a ray cast from the cursor.

12. The computer-implemented method of claim 9, wherein the steps of extracting, computing and constructing are repeated while the user interacts with the screen.

13. The computer-implemented method of claim 7, wherein the steps of extracting, computing and constructing are repeated for each provided three dimensional modeled object.

14. A non-transitory computer readable storage medium having recorded thereon a computer program, for designing a three-dimensional modeled object, the computer program comprising computer code for:

receiving user-interaction with a screen that represents a two-dimensional plane;

defining a stroke corresponding to the user-interaction with the screen;

discretizing the stroke into a set of points;

defining in a three-dimensional scene at least one support that is a surface on which the points of the discretized stroke can be projected, wherein a support of the at least one support is: (i) different from the two-dimensional plane of the screen, (ii) adapted for receiving points, and (iii) configured to be manipulated to create another support in the three-dimensional scene;

projecting the set of points of the discretized stroke onto said at least one support in the three-dimensional scene, wherein projecting the set of points accounts for a user viewpoint and each projected point of the set has a new position on the at least one support; and constructing the three-dimensional modeled object from the projected set of points and a coordinate of the said at least one support in the three-dimensional scene.

15. The computer readable storage medium of claim 14 having recorded thereon a computer program, the computer program further comprising computer code for visualization of the three-dimensional modeled object by:
   computing, for each point of the projected set of points, at least two offset points, an offset point being a point positioned on said at least one support and spaced from said each point; and
   computing a surface delineated by the computed at least two offset points, the surface comprising the projected set of points.

16. The computer program product of claim 15, wherein the computing of at least two offset points comprises:
   computing a poly-line linking the points of the projected set of points;
   computing, for each point of the projected set of points, an offset vector $\vec{O}=\alpha *\vec{n}\wedge\vec{L}$, wherein $\alpha$ is a coefficient, $\vec{n}$ is a unit vector normal to the at least one support, $\vec{L}$ is a vector defined by a line linking two points of the set of points forming the poly-line, $\vec{n}$ and $\vec{L}$ having as common origin the said each point;
   determining the said at least two offset points from the offset vector $\vec{O}$; and
   projecting the determined said at least two offset points onto said at least one support in a three-dimensional scene.

17. The computer readable storage medium of claim 15 having recorded thereon a computer program, the computer program further comprising computer code for tessellating said computed surface delineated by the computed offset.

18. A non-transitory computer readable storage medium having recorded thereon a computer program, for designing an interactive three-dimensional geometrical modeled object, the computer program comprising computer code for:
   providing a set of three-dimensional modeled objects designed by:
      receiving user-interaction with a screen that represents a two-dimensional plane;
      defining a stroke corresponding to the user-interaction with the screen;
      discretizing the stroke into a set of points, each point having a position on the two-dimensional plane;
      defining in a three-dimensional scene at least one support that is a surface on which the points of the discretized stroke can be projected, wherein a support of the at least one supports is: (i) different from the two-dimensional plane of the screen, (ii) adapted for receiving points, and (iii) configured to be manipulated to create another support in the three-dimensional scene;
      projecting the set of points of the discretized stroke onto said at least one support defined in the three-dimensional scene, wherein projecting the set of points accounts for a user viewpoint and each projected point of the set has a new position on the at least one support;
      constructing the three-dimensional modeled objects from the projected set of points and a coordinate of the said at least one support in the three-dimensional scene;
   extracting the points of the provided set of three-dimensional modeled objects;
   computing a geometrical smooth curve from the extracted points; and
   constructing an interactive three-dimensional geometrical modeled object from the geometrical smooth curve.

19. The computer readable storage medium of claim 18 having recorded thereon a computer program where the extracting comprises extracting the points according to the support on which the points are projected.

20. The computer readable storage medium of claim 18 having recorded thereon a computer program wherein the extracting further comprises:
   user-interacting with the screen;
   defining a stroke corresponding to the user-interacting with the screen;
   retrieving, among the extracted points, one of three-dimensional modeled objects of the provided set of three-dimensional modeled objects and at least one support of said one of three-dimensional modeled objects retrieved;
   discretizing the stroke corresponding to the user-interacting into a set of points;
   projecting the points on the set of points onto the said at least one retrieved support.

* * * * *

UNITED STATES PATENT AND TRADEMARK OFFICE
CERTIFICATE OF CORRECTION

PATENT NO. : 10,108,750 B2  
APPLICATION NO. : 13/461428  
DATED : October 23, 2018  
INVENTOR(S) : Jean Hong et al.

Page 1 of 1

It is certified that error appears in the above-identified patent and that said Letters Patent is hereby corrected as shown below:

In the Claims

In Claim 3, Column 17, Line 24, delete " $\vec{O}=\alpha*(\vec{n}\wedge\vec{L}$ " and replace it with -- $\vec{O}=\alpha*(\vec{n}\wedge\vec{L})$ --;

In Claim 16, Column 19, Line 21, delete " $\vec{O}=\alpha*\vec{n}\wedge\vec{L})$ " and replace it with -- $\vec{O}=\alpha*(\vec{n}\wedge\vec{L})$ --.

Signed and Sealed this  
Eleventh Day of December, 2018

Andrei Iancu  
*Director of the United States Patent and Trademark Office*